(12) United States Patent
Knickerbocker et al.

(10) Patent No.: US 10,520,679 B2
(45) Date of Patent: Dec. 31, 2019

(54) FIBER ALIGNMENT TO PHOTONICS CHIP

(71) Applicant: GLOBALFOUNDRIES INC., Grand Cayman (KY)

(72) Inventors: Sarah Knickerbocker, Poughkeepsie, NY (US); Jorge Lubguban, Danbury, CT (US); Tracy Tong, Wallkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/000,011

(22) Filed: Jun. 5, 2018

(65) Prior Publication Data
US 2019/0369339 A1    Dec. 5, 2019

(51) Int. Cl.
*G02B 6/30* (2006.01)
*G02B 6/36* (2006.01)
*G02B 6/42* (2006.01)

(52) U.S. Cl.
CPC ............. *G02B 6/3652* (2013.01); *G02B 6/30* (2013.01); *G02B 6/4228* (2013.01); *G02B 6/4239* (2013.01)

(58) Field of Classification Search
None
See application file for complete search history.

(56) References Cited

U.S. PATENT DOCUMENTS

| | | | | |
|---|---|---|---|---|
| 5,787,214 | A * | 7/1998 | Harpin | G02B 6/4207 385/49 |
| 9,129,986 | B2 | 9/2015 | Zang et al. | |
| 2004/0214377 | A1 | 10/2004 | Starkovich et al. | |
| 2007/0292086 | A1* | 12/2007 | Nielson | G02B 6/32 385/88 |
| 2017/0293073 | A1* | 10/2017 | Chen | G02B 6/122 |

OTHER PUBLICATIONS

Kolari, K.,"High Etch Selectivity for Plasma Etching SiO2 with AlN and Al2O3 Masks"; Microelectronic Engineering 85 (2008) pp. 985-987.

* cited by examiner

*Primary Examiner* — Michelle R Connelly
(74) *Attorney, Agent, or Firm* — David Cain; Hoffman Warnick LLC

(57) ABSTRACT

An optical system includes a photonics chip, a bridge waveguide structure formed on the chip, and an optical fiber disposed over the chip and optically aligned with the bridge waveguide structure. A cavity between the bridge waveguide structure and the chip is at least partially filled with an adhesive resin and a filler material having a coefficient of thermal expansion (CTE) less than that of the adhesive resin. The filler material may include filler particles dispersed throughout the adhesive resin, or a discrete layer of material separate from the adhesive resin. The composite adhesive material filling the cavity has an effective coefficient of thermal expansion less than the coefficient of thermal expansion of conventional adhesive resins. This lower effective CTE improves the survivability of the overlying bridge waveguide structure following thermal cycling of the optical system.

20 Claims, 6 Drawing Sheets

FIBER ALIGNMENT TO PHOTONICS CHIP

BACKGROUND

The present application relates generally to optical devices, and more specifically to methods and structures for aligning and securing an optical fiber to a semiconductor chip such as a photonics chip.

Silicon photonics is a promising technology platform for delivering high-performance optical devices. Silicon photonics relates to the design and development of optical systems that use silicon as an optical medium. In such devices, silicon (Si) is patterned with sub-micron precision into silicon photonic components adapted to receive and process light. Optical fibers are commonly used to transmit optical data to and from a silicon-based photonics chip.

The alignment of optical components such as an individual optical fiber or a fiber array connector (FAC) to a waveguide or other optical component on a photonics chip continues to be a challenge to chip manufacturers. In various alignment schemes, an optical fiber may be positioned onto a chip and aligned with a waveguide or other incumbent structure such as a microelectromechanical system (MEMS) architecture by first machining or etching a groove into the chip, and then placing the optical fiber(s), fiber block or fiber-containing ribbon within the groove. A cover plate may be disposed over the fiber, and an adhesive material may be used to hold the fiber and the cover plate in place.

Processing subsequent to fiber alignment may include a flip-chip module, such as a controlled collapse chip connection (C4) module, or a ball grid array (BGA) laminate to connect the chip to external circuitry such as a printed circuit board. The thermal budget associated with the flip-chip or BGA module, however, including the attendant heating and reflow of solder bumps, may induce thermal strain that causes permanent deformation or even fracture of other on-chip components, including waveguides and/or MEMS structures. In various approaches, thermally-induced deformation of the adhesive layer used to secure the fiber may be transferred to adjacent components, which may have an adverse effect on device performance and manufacturing yield.

Notwithstanding recent developments, it remains a challenge to co-integrate optical fiber alignment and bonding with the thermal budget associated with solder bump reflow without compromising the mechanical integrity of various on-chip structures.

SUMMARY

Accordingly, it would be beneficial to provide methods and structures for aligning optical fibers to optical components present on a photonics chip, including waveguides, and securing the fibers without realizing thermally-induced distortion or deformation of the various on-chip components during subsequent processing, especially during reflow.

As disclosed herein, the manufacture of optical modules includes the formation of a waveguide on a photonics chip, the formation of a groove in the chip proximate to the waveguide, the placement of an optical fiber within the groove and optically aligned to the waveguide, and the dispersal of a composite adhesive and, optionally, a non-composite adhesive beneath the waveguide, i.e., between the waveguide and the chip, and optionally between the optical fiber and the chip to secure the optical fiber to the chip. In certain embodiments, the waveguide may include a bridging architecture.

As will be appreciated, the coefficient of thermal expansion of the composite adhesive, particularly at locations between the waveguide and the chip, is tailored to lessen the thermally-induced strain realized by the waveguide, such as during a solder bump reflow step. Furthermore, the index of refraction of the composite adhesive is controlled to efficiently couple light between the optical fiber and the waveguide.

According to various embodiments, an optical system includes a semiconductor substrate, a bridge waveguide structure comprising a waveguiding layer material, wherein the bridge waveguide structure is laterally supported by the semiconductor substrate and extends over and is spatially separated from a portion of the semiconductor substrate by a cavity in the semiconductor substrate, and a composite adhesive disposed within the cavity.

According to further embodiments, a method of forming an optical system includes forming a bridge layer over a semiconductor substrate, wherein the bridge layer comprises a waveguiding layer material, selectively etching the semiconductor substrate with respect to the bridge layer to form a cavity in the semiconductor substrate underlying the bridge layer, the cavity spatially separating the substrate from a bridge waveguide structure comprising the waveguiding layer material, wherein the bridge waveguide structure is laterally supported by the semiconductor substrate, and forming a layer of composite adhesive within the cavity.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
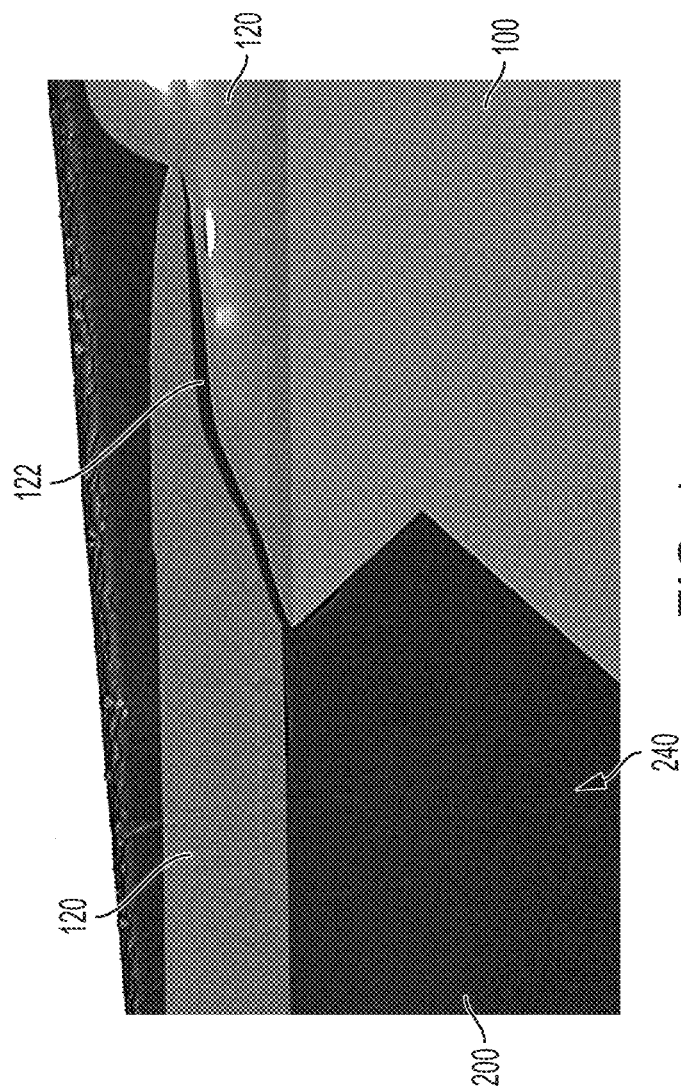
FIG. 1 is a cross-sectional scanning electron microscope (SEM) micrograph evidencing the formation of a crack through a bridge waveguide structure following a reflow step.

Reference will now be made in greater detail to various embodiments of the subject matter of the present application, some embodiments of which are illustrated in the accompanying drawings. The same reference numerals will be used throughout the drawings to refer to the same or similar parts.

Referring to FIG. 1, a scanning electron microscope (SEM) micrograph depicts a portion of a comparative optical module. The optical module includes a substrate (e.g., chip) 100 and a bridge waveguide structure 120 contiguous with and extending over the substrate 100. In certain embodiments, the bridge waveguide structure 120 is adapted to function as an optical waveguide, i.e., a suspended waveguide. A layer of adhesive 200 is disposed within cavity 240 between the bridge waveguide structure 120 and the substrate 100. Following a reflow step and the attendant heating and cooling of the optical module, a crack 122 is formed in and extends through the bridge waveguide structure 120. The crack 122 creates discontinuity in the waveguide and adversely affects performance of the optical module.

By way of example, a reflow process may include heating the substrate 100 from room temperature (e.g., 25° C.) to a target temperature of 180-300° C. at a heating rate of 25° C./min, maintaining the target temperature for a dwell time of 60-120 seconds, and cooling the substrate to 25° C. at a cooling rate of 25° C./min.

Without wishing to be bound by theory, it is believed that a mismatch in the coefficients of thermal expansion between the bridge waveguide structure 120 and the underlying adhesive 200 results in strain to failure of the bridge waveguide structure as a consequence of thermal cycling.

As will be appreciated, substrate 100 may define a portion of a photonics chip, and may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries. The semiconductor substrate 100 may include (100)-oriented silicon or (111)-oriented silicon, for example.

The substrate 100 is not limited to silicon-containing materials, however, as the substrate 100 may include other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that includes, from bottom to top, a handle portion, an isolation layer (e.g., buried oxide layer), and a semiconductor material layer (e.g., silicon).

Figure 2:
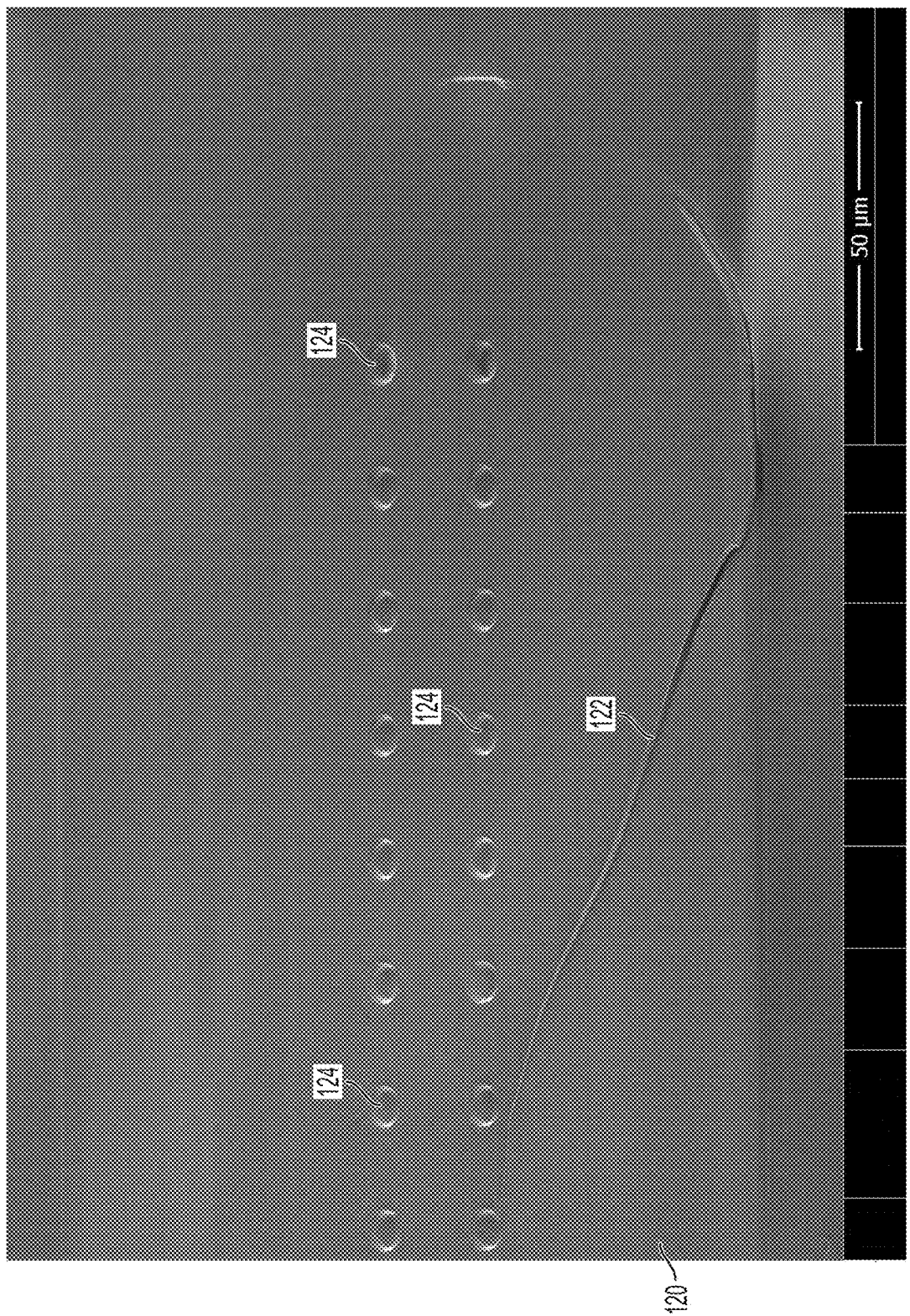
FIG. 2 is an SEM micrograph showing a perspective view of a cracked bridge waveguide structure overlying a semiconductor substrate.

Referring to FIG. 2, shown is a perspective view of the bridge waveguide structure 120 including crack 122. In various embodiments the bridge waveguide structure 120 is plate-shaped and may include one or more apertures 124 extending therethrough. In example embodiments, apertures 124 may be substantially circular or oval and have a diameter of 5 to 15 microns. Apertures 124 may be formed using conventional photolithography and etching techniques.

Bridge waveguide structure 120 may be formed using a selective, anisotropic etch process. Example methods of forming bridge waveguide structure 120 leverage a difference in the etch rate of materials having different compositions, or a difference in the etch rate of different crystal planes in a given crystalline material. For instance, when single crystal silicon (Si) is etched, the etch rate along densely-packed directions, e.g., <111> directions, may be less than the etch rate along <100> and <110> directions. This etch rate anisotropy can be used to selectively etch a layer or region having one crystallographic orientation relative to a neighboring layer or region having a different crystallographic orientation.

To form a bridge waveguide structure 120, in certain embodiments, a bridge layer is formed over semiconductor substrate 100. The composition and/or crystalline habit of the bridge layer are chosen such that the underlying substrate can be etched selectively with respect to the bridge layer, e.g., through apertures 124, to form a cavity 240 between the bridge layer and the substrate and thereby reveal a bridge waveguide structure 120. In various embodiments, bridge waveguide structure 120 extends horizontally over substrate 100 and, by way of example, may be cantilevered, i.e., supported at 1, 2 or 3 (out of four) sides. Thus, cavity 240 can be formed by etching away a portion of the substrate 100 beneath the bridge layer.

In certain embodiments, the bridge layer and therefore the bridge waveguide structure 120 includes a waveguiding layer material, such as an oxide material or a polymeric material. An oxide material may include silicon dioxide, for example. In certain embodiments, the waveguiding layer material has a lower refractive index than the semiconductor substrate.

An example bridge waveguide structure 120 has a thickness of 5 to 20 microns, e.g., 5, 10, 15 or 20 microns, including ranges between any of the foregoing values. A depth of the cavity 240, measured from the bridge waveguide structure 120 to the substrate 100, may range from 50 to 200 microns, e.g., 50, 100, 150 or 200 microns, including ranges between any of the foregoing values.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

As used herein, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

Figure 3:
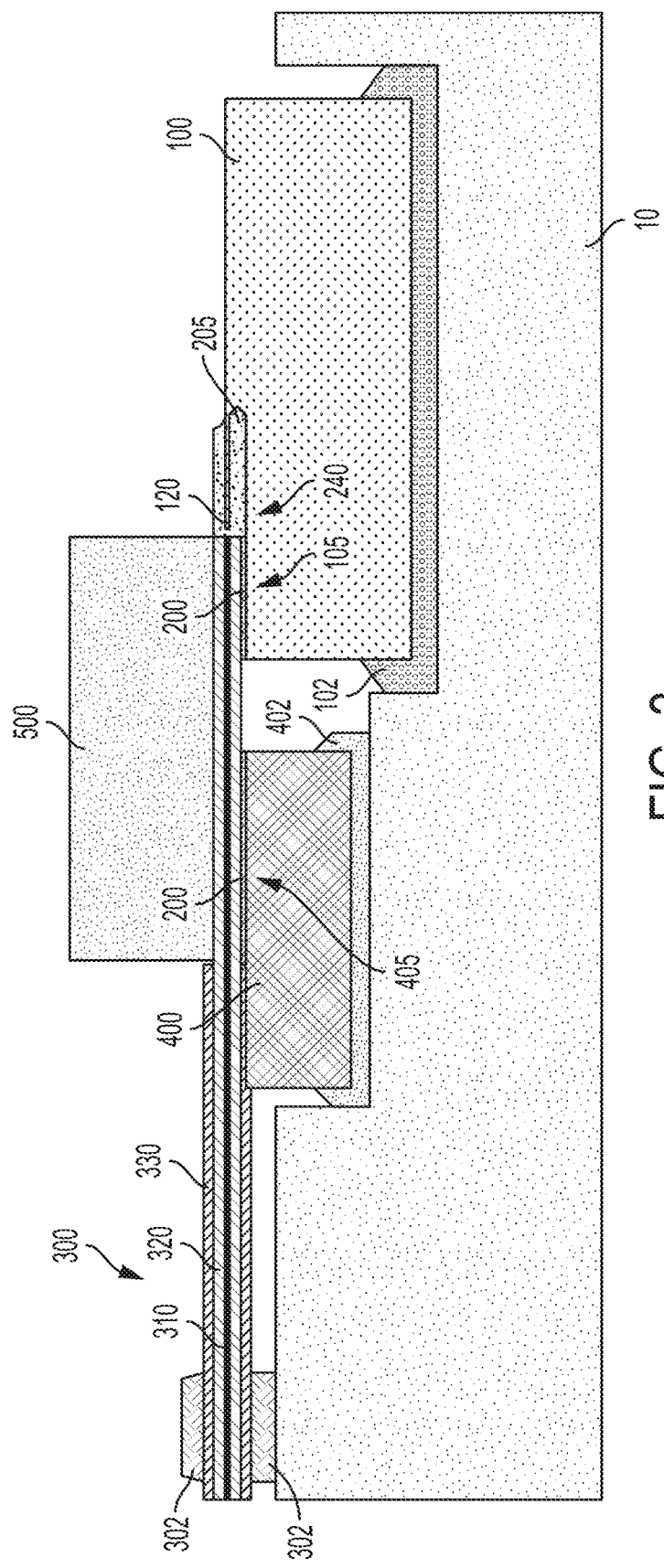
FIG. 3 is a cross-sectional schematic view of an optical module including an optical fiber aligned to a photonic integrated circuit (PIC) die.

Various embodiments relate to an optical system wherein an optical component such as an optical fiber is axially aligned to a bridge waveguide structure 120. Referring to FIG. 3, for example, an optical system includes a substrate 100 having a bridge waveguide structure 120 disposed over the substrate 100, and an optical fiber 300 aligned with the bridge waveguide structure 120. Substrate 100 may be a photonic integrated circuit (PIC) die. As used herein, a photonic integrated circuit (PIC) or integrated optical circuit is a device that integrates multiple photonic functions. As will be appreciated by those skilled in the art, the optical fiber 300 may include a center core 310, cladding 320 and an insulating jacket 330.

As used herein, an optical fiber that is "aligned," "axially aligned," or "optically aligned" with a bridge waveguide structure is configured to transmit, i.e., send or receive, an optical signal to or from the bridge waveguide structure.

An upper surface of the chip 100 may be machined or etched to include multiple, parallel V-grooves 105. In certain embodiments, the V-grooves 105 in the chip 100 may be aligned with additional V-grooves 405 that are similarly formed in an adjacent V-groove block 400. The V-groove block 400, which may be omitted, provides additional support for the fiber(s).

As illustrated, the optical fiber 300 is positioned within a V-groove 105 formed in the substrate 100 and is aligned to the bridge waveguide structure 120 so that optical signals can be transmitted between the optical fiber 300 and the photonics chip 100. The photonics chip 100 may include a diode or a diode array, for example, configured to convert light into electrical energy or vice versa.

As used here, the term "optical fiber" may refer to the combination of the center core 310, cladding layer 320 and insulating jacket 330, or to the combination of the center core 310 and the cladding 320 in examples where the insulating jacket is removed. In the illustrated embodiment, the insulating jacket 330 is removed from the optical fiber 300 along the portions thereof where the optical fiber is disposed within the V-grooves 105, 405. In alternate embodiments, both the insulating jacket 330 and the cladding 320 may be removed along portions of the optical fiber that are disposed within the V-grooves. By way of example, an optical fiber, including a center core 310 and a cladding layer 320, may have a diameter of 100 to 200 microns.

The optical fiber 300 is positioned within co-linear V-grooves formed in both the V-groove block 400 and the substrate 100, and is thereby aligned with bridge waveguide structure 120.

When an optical fiber 300 is placed in the V-grooves 105, 405, the optical fiber 300 may extend above an upper surface of the substrate 100 and/or an upper surface of the V-groove block, the optical fiber 300 may be fully recessed below respective upper surfaces of the substrate 100 and the V-groove block 400, or a top surface of the optical fiber 300 may be co-planar with a top surface of the substrate 100 and/or a top surface of the V-groove block 400. The substrate 100 and the V-groove block 400 each overlie a carrier 10, such as a printed circuit board, and may be affixed thereto by respective die attach adhesive layers 102, 402. A strain relief adhesive layer 302 may be used to secure fiber 300 directly to the carrier 10.

A layer of optical adhesive 200 is disposed within V-grooves 105 between the optical fiber 300 and the substrate 100, and within V-grooves 405 between the optical fiber 300 and the V-groove block 400 such that the relative positions between these components are fixed. The optical adhesive 200 may include a polymer resin, for example, such as a UV- or thermally-curable epoxy resin. Example resins may be characterized by one or more of a refractive index of 1.3 to 1.6, e.g., 1.3, 1.4, 1.45, 1.5, 1.55 or 1.6, including ranges between any of the foregoing values, a viscosity (at 23° C.) of 200 to 600 cP, a glass transition temperature ($T_g$) of 0° C. to 140° C., an optical transmittance (at 1.3 microns) of at least 85%, e.g., 85, 88, 90, 92 or 94%, including ranges between any of the foregoing values, and a bond strength of 100 to 200 kgf/cm$^2$.

A cover plate 500 is disposed over the fiber(s) 300 and secured using the layer of optical adhesive 200. In the illustrated embodiment, a single cover plate 500 is disposed over portions of the V-groove block 400 and over portions of the substrate 100. In alternate embodiments, a separate cover plates may be disposed over respective ones of the V-groove block 400 and the substrate 100.

The cover plate 500 may be made from any material adapted to provide structural support and hold the fibers 300 within the grooves 105, 405. An example cover plate is formed from a glass composition. Cover plate 500 may be a glass plate, for example. In various embodiments, optical fibers are disposed within V-grooves between the cover plate 500 and the substrate 100, and the cover plate 500 is used to ensure that the fibers contact the sidewalls of the V-grooves 105, 405 and are properly aligned therein.

As described in further detail herein, a composite adhesive 205 is used to fill the cavity 240 between the bridge waveguide structure 120 and the substrate 100, and optionally to secure optical fibers 300 within respective V-grooves 105, 405. In various embodiment, the composite adhesive 205 contacts both the bridge waveguide structure 120 and the underlying substrate 100 and is adapted to support the bridge waveguide structure 120.

The composite adhesive 205 includes a polymer or resin 210 and a filler 215. The resin 210 may include an adhesive composition such as a curable (e.g., UV-curable or thermally-curable) epoxy acrylate or other suitable material. Example filler materials include low coefficient of thermal expansion (CTE) particles and fibers, such as silica particles, e.g., fumed silica particles, and fibers of molybdenum or tungsten, although other low CTE filler materials are contemplated. For instance, a further filler material 215 is air, i.e., air-filled pores dispersed throughout the resin 210. In certain embodiments, a pore-containing composite adhesive may be formed by aerating a suitable resin. As will be appreciated, a composite adhesive 205, which includes a filler 215, is distinct from an optical adhesive 200.

Particulate fillers may have a particle (or pore) size of 10 nanometers to 10 microns, e.g., 10, 20, 50, 100, 200, 500, 1000, 2000, 5000 or 10000 nm, including ranges between any of the foregoing values. Fibrous fillers may be characterized by a diameter and a length. Example fibrous fillers have a diameter of 10 nanometers to 10 microns, e.g., 10, 20, 50, 100, 200, 500, 1000, 2000, 5000 or 10000 nm, including ranges between any of the foregoing values, and a length of 20 nm to 100 microns, e.g., 20, 50, 100, 200, 500, 1000, 2000, 5000, 10000, 20000, 50000 or 100000 nm, including ranges between any of the foregoing values.

Example resins 210 may have a coefficient of thermal expansion at 23° C. of $50\times10^{-6}$ to $200\times10^{-6}/°$ C., e.g., $50\times10^{-6}$, $80\times10^{-6}$, $100\times10^{-6}$, $150\times10^{-6}$ or $200\times10^{-6}/°$ C., including ranges between any of the foregoing values, while the filler material 215 may have a coefficient of thermal expansion at 23° C. of $0.5\times10^{-6}/°$ C. to $50\times10^{-6}/°$ C., e.g., $0.5\times10^{-6}/°$ C., $1\times10^{-6}/°$ C., $2\times10^{-6}/°$ C., $5\times10^{-6}/°$ C., $10\times10^{-6}/°$ C., $20\times10^{-6}/°$ C. or $50\times10^{-6}/°$ C., including ranges between any of the foregoing values. As used herein, a "low CTE" filler has a CTE of $0.5\times10^{-6}/°$ C. to $50\times10^{-6}/°$ C. at 23° C.

In various embodiments, the composite adhesive 205 dispersed within cavity 240 may include a physical mixture of the resin 210 and the filler 215. For example, the filler 215 may be homogeneously or non-homogeneously distributed throughout the resin 210.

Example composite adhesives 205 include up to 95 vol. % filler, e.g., 5, 10, 20, 30, 40, 50, 60, 70 80, 90 or 95 vol. %, including ranges between any of the foregoing values. In various embodiments, the composite adhesive material 205 is a multi-phase, e.g., 2-phase, mixture.

In further embodiments, the resin 210 and the filler 215 may be disposed within cavity 240 as separate, unmixed layers. For example, the filler 215 may include low CTE particles or fibers that are added to cavity 240 independent of the resin 210. In such embodiments, the filler 215 may occupy up to 95% of the cavity volume, e.g., 5, 10, 20, 30, 40, 50, 60, 70, 80, 90 or 95 vol. %, including ranges between any of the foregoing values.

As will be appreciated, the composite adhesive 205 has a coefficient of thermal expansion (CTE) less than that of the resin alone. The composite adhesive is configured to have a CTE that is comparable to the CTE of the bridge waveguide structure 120. For example, the coefficient of thermal expansion of the composite adhesive material 205 at 23° C. may range from $5 \times 10^{-6}/°$ C. to $40 \times 10^{-6}/°$ C., e.g., $5 \times 10^{-6}$, $10 \times 10^{-6}$, $15 \times 10^{-6}$, $20 \times 10^{-6}$, $30 \times 10^{-6}$ or $40 \times 10^{-6}/°$ C., including ranges between any of the foregoing values. By combining a low CTE filler with the resin, the effective CTE of the composite adhesive within cavity 240 can be controlled.

After forming bridge waveguide structure 120 and placing an optical fiber 300 within an associated V-groove, the composite adhesive material 205 may be dispensed into cavity 240 to fill the cavity. For instance, the composite adhesive material 205 may be dispensed to fill or substantially fill the cavity 240 beneath the bridge waveguide structure 120. As used herein, a composite adhesive material 205 that fills at least 90% by volume of a cavity 240, e.g., 90, 95, 98, 99 or 100 vol. %, including ranges between any of the foregoing values, "substantially fills" the cavity.

The composite adhesive material 205 may initially be sufficiently fluid so as to readily fill cavity 240 and optionally the interstices between the optical fiber 300 and the V-grooves 105, 405. As shown schematically in FIG. 3, a layer of the composite adhesive material 205 may also be formed over a top surface of the bridge waveguide structure 120. In embodiments where a composite adhesive is disposed both over a top surface of the bridge waveguide structure and between the bridge waveguide structure and the substrate, the respective layers of composite adhesive may have the same or comparable coefficients of thermal expansion, i.e., coefficients of thermal expansion that differ by less than 10%, e.g., less than 10, 5, 2 or 1%, including ranges between any of the foregoing values. In particular embodiments, the composite adhesive disposed over a top surface of the bridge waveguide structure may include the same resin and/or the same filler as the composite adhesive disposed between the bridge waveguide structure and the substrate. In further embodiments, the composite adhesive is disposed over a sidewall of the bridge waveguide structure, i.e., between the top and bottom surfaces of the bridge waveguide structure.

In certain embodiments, a composite adhesive material 205 may be dispensed into cavity 240 between the bridge waveguide structure 120 and the substrate, as well as within V-grooves 105, 405 to secure the optical fiber 300. In certain embodiments, a composite adhesive material 205 may be dispensed into cavity 240 between the bridge waveguide structure 120 and the substrate, while an adhesive composition 200 not containing a filler may be deposited within V-grooves 105, 405 to secure the optical fiber. An adhesive not containing a filler may be deposited between the distal end of the optical fiber and the bridge waveguide structure 120.

The composite adhesive material may be dispensed using a suitable dispense system, such as a micro fluid dispense system marketed by Nordson (East Providence, R.I.). An example dispense system may include portable or bench-top dispense system that is operable to a pressurize and deliver through a dispensing tip an effective amount of a composite adhesive material to a desired location on an optical system, e.g., using a 3-axis micromanipulator for controlling the tip location.

By combining a filler material 215 with a resin 210, where the CTE of the filler material 215 is less than the CTE of the resin 210, the CTE of the resulting composite adhesive 205 may be decreased relative to the resin alone, such that the impact of thermal cycling of an optical system having the composite adhesive 205 incorporated into the cavity 240 beneath a bridge waveguide structure 120 does not result in the formation of a crack 122 in the bridge waveguide structure 120.

Figure 4:
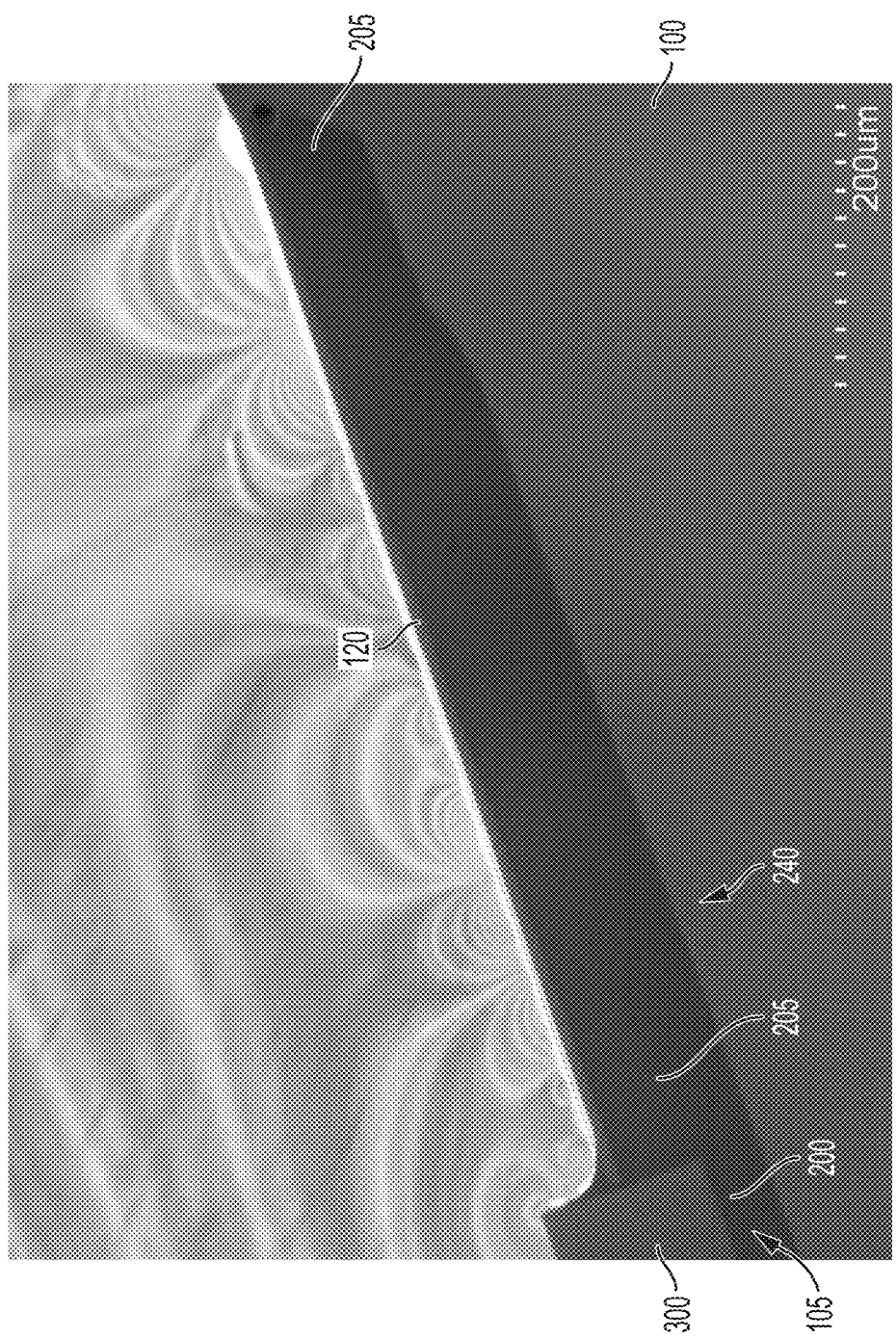
FIG. 4 is a cross-sectional SEM micrograph of a bridge waveguide structure overlying a semiconductor substrate, an optical fiber located proximate to the bridge waveguide structure, and a layer of composite adhesive disposed between the bridge waveguide structure and the substrate.

Referring to FIG. 4, shown is a cross-sectional SEM micrograph of a bridge waveguide structure 120 overlying a semiconductor substrate 100, and an optical fiber 300 positioned within V-groove 105. A layer of composite adhesive 205 is disposed within cavity 240 between the bridge waveguide structure 120 and the substrate 100, and a layer of optical adhesive 200 is disposed within groove 105 between the fiber 300 and the substrate 100.

Figure 5:
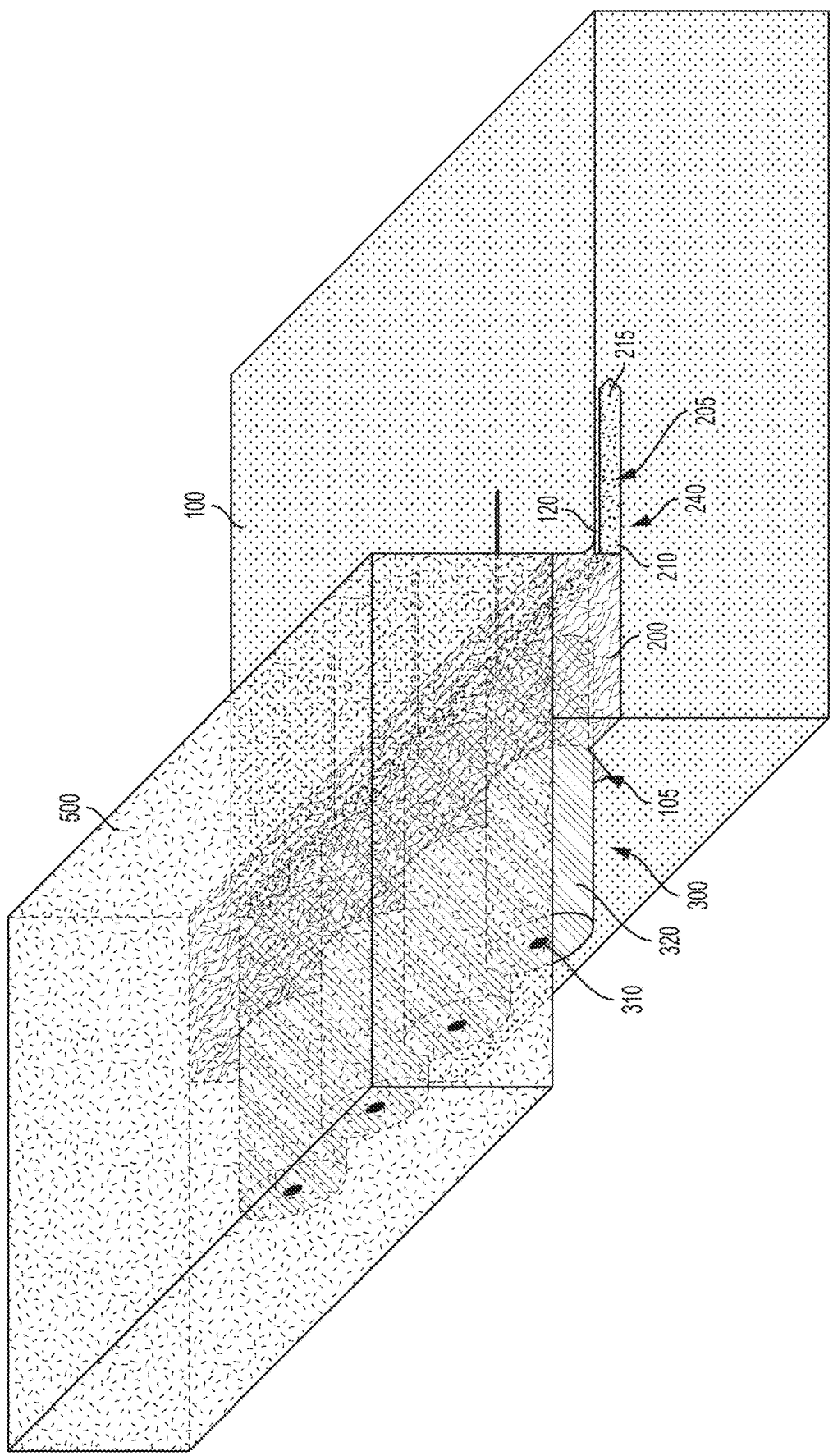
FIG. 5 is a perspective schematic view of a plurality of optical fibers located within grooves formed in a PIC die proximate to a bridge waveguide structure following the formation of a layer of a composite adhesive between the bridge waveguide structure and the PIC die.

FIG. 5 is a perspective schematic view of an optical system including a plurality of optical fibers 300 located within respective grooves 105 in substrate 100 and axially aligned with a bridge waveguide structure 120 formed in the substrate 100. A glass cover plate 500 is disposed over the fibers 300. A layer of optical adhesive 200 is disposed within grooves 105 between the fibers 300 and the substrate 100 and between the substrate 100 and the cover plate 500. A layer of composite adhesive 205 is disposed within cavity 240 between the bridge waveguide structure 120 and the substrate 100. In the embodiment of FIG. 5, the composite adhesive 205 includes a homogeneous mixture of filler material particles 215, e.g., fumed silica particles, and resin 210.

Figure 6:
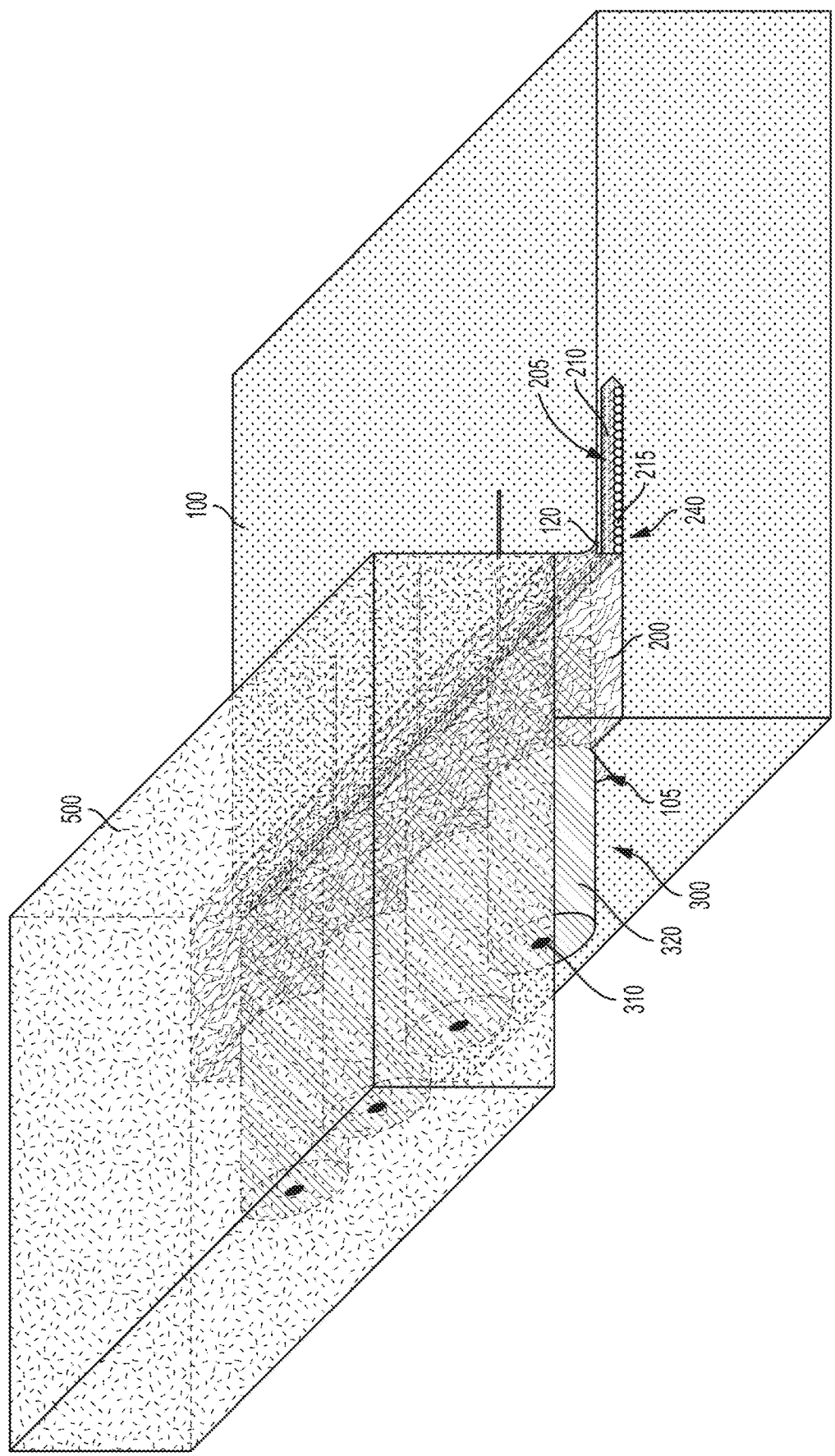
FIG. 6 is a perspective schematic view of a plurality of optical fibers located within grooves formed in a PIC die proximate to a bridge waveguide structure following the incorporation of a fill material and an optical adhesive between the bridge waveguide structure and the PIC die.

FIG. 6 is a perspective schematic view of an optical system according to further embodiments. The optical system and includes a plurality of optical fibers 300 disposed within grooves 105 in substrate 100 and axially aligned with a bridge waveguide structure 120. A glass cover plate 500 is disposed over the fibers 300. A layer of optical adhesive 200 is disposed within grooves 105 between the fibers 300 and the substrate 100 and between the substrate 100 and the cover plate 500. A composite adhesive 205 is disposed within the cavity 240 between the bridge waveguide structure 120 and the substrate 100. In the embodiment of FIG. 6, the composite adhesive 205 includes a layer of resin 210 overlying a plurality of low CTE fibers 215. In alternate embodiments, the composite adhesive 205 may include a layer of resin 210 and a layer of a low CTE filler material, such as a low CTE glass composition.

In example optical systems, the refractive index (n) of the composite adhesive material 205 may be adapted to facilitate low loss, refractive index matching between the optical fiber 300 and the bridge waveguide structure 120. For instance, the composite adhesive material 205 may have a refractive index equal to, or substantially equal to, a portion of the bridge waveguide structure 120. As used herein a first value is "substantially equal to" a second value if the first value differs from the second value by 10% or less, e.g., 0, 1, 2, 5, or 10%, including ranges between any of the foregoing values.

In certain embodiments, after incorporating the composite adhesive material 205 into the optical system, the composite adhesive material 205 may have a refractive index of 1.3 to 1.6, e.g., 1.3, 1.4, 1.45, 1.5, 1.55 or 1.6, including ranges between any of the foregoing values. That is, in certain embodiments, the composite adhesive material 205 may be characterized by a refractive index of 1.3 to 1.6 after curing.

Disclosed herein, an optical system includes a photonics chip including a bridge waveguide structure, and an optical fiber disposed over the chip and optically aligned with the bridge waveguide structure. A cavity between the bridge waveguide structure and the chip is at least partially filled with an adhesive resin and a filler material having a coefficient of thermal expansion less than that of the adhesive resin. The composite adhesive material may include filler particles dispersed throughout the adhesive resin, or a discrete later of material separate from the adhesive resin. The composite material filling the cavity has an effective coefficient of thermal expansion less than the coefficient of thermal expansion of conventional adhesive resins, which improves the survivability of the overlying bridge waveguide structure following thermal cycling of the optical system.

As used herein, the singular forms "a," "an" and "the" include plural referents unless the context clearly dictates otherwise. Thus, for example, reference to a "filler material" or an "optical fiber" includes examples having two or more such "filler materials" or two or more such "optical fibers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a bridge waveguide structure that comprises silicon dioxide include embodiments where a bridge waveguide structure consists essentially of silicon dioxide and embodiments where a bridge waveguide structure consists of silicon dioxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An optical system, comprising:
   a semiconductor substrate;
   a bridge waveguide structure comprising a waveguiding layer material, wherein the bridge waveguide structure is laterally supported by the semiconductor substrate and extends over and is spatially separated from a portion of the semiconductor substrate by a cavity in the semiconductor substrate;
   an optical fiber aligned with the bridge waveguide structure to transmit an optical signal thereto;
   a composite adhesive disposed within the cavity, wherein the composite adhesive includes a resin and a plurality of air-filled pores being dispersed throughout the resin; and
   a non-composite adhesive disposed between the bridge waveguide structure and an end portion of the optical fiber.

2. The optical system of claim 1, wherein the composite adhesive substantially fills the cavity.

3. The optical system of claim 1, wherein the composite adhesive is in contact with both the semiconductor substrate and the bridge waveguide structure.

4. The optical system of claim 1, wherein the composite adhesive is further disposed over a top surface of the bridge waveguide structure.

5. The optical system of claim 1, wherein the composite adhesive is further disposed over a sidewall of the bridge waveguide structure facing towards the end portion of the optical fiber.

6. The optical system of claim 1, wherein the optical fiber is disposed in a V-groove located in a top surface of the semiconductor substrate.

7. A method of forming an optical system, comprising:
   forming a bridge layer over a semiconductor substrate, wherein the bridge layer comprises a waveguiding layer material;
   selectively etching the semiconductor substrate with respect to the bridge layer to form a cavity in the semiconductor substrate underlying the bridge layer, the cavity spatially separating the substrate from a bridge waveguide structure comprising the waveguiding layer material, wherein the bridge waveguide structure is laterally supported by the semiconductor substrate;
   forming a layer of composite adhesive within the cavity, wherein the composite adhesive includes a resin and air-filled pores dispersed throughout the resin;
   aligning an optical fiber with the bridge waveguide structure to transmit an optical signal thereto; and
   forming a non-composite adhesive between the bridge waveguide structure and an end portion of the optical fiber.

8. The method of claim 7, wherein the composite adhesive substantially fills the cavity.

9. The method of claim 7, further comprising forming the composite adhesive over a top surface of the bridge waveguide structure.

10. The method of claim 7, further comprising curing the resin after forming the layer of composite adhesive within the cavity.

11. The method of claim 7, further comprising:
    forming a V-groove in an upper surface of the semiconductor substrate;
    placing the optical fiber within the V-groove; and
    forming a layer of optical adhesive within the V-groove and in contact with the optical fiber.

12. The method of claim 7, wherein forming the layer of composite adhesive comprises:
    placing a layer of a material having a low coefficient of thermal expansion within the cavity; and forming a layer of resin within the cavity and over the layer of the material having a low coefficient of thermal expansion.

13. An optical system, comprising:
a semiconductor substrate;
a bridge waveguide structure comprising a waveguiding layer material, wherein the bridge waveguide structure is laterally supported by the semiconductor substrate and extends over and is spatially separated from a portion of the semiconductor substrate by a cavity in the semiconductor substrate;
an optical fiber aligned with the bridge waveguide structure to transmit an optical signal thereto;
a composite adhesive disposed within the cavity, wherein the composite adhesive includes a plurality of fibers of tungsten or molybdenum and a layer of resin overlying the plurality of fibers; and
a non-composite adhesive disposed between the bridge waveguide structure and an end portion of the optical fiber.

14. The optical system according to claim 13, wherein the non-composite adhesive further covers the end portion of the optical fiber and is in contact with the composite adhesive.

15. The optical system according to claim 13, wherein the composite adhesive is in contact with both the semiconductor substrate and the bridge waveguide structure.

16. The optical system according to claim 13, wherein the composite adhesive is further disposed over a top surface of the bridge waveguide structure.

17. The optical system according to claim 13, wherein the optical fiber is disposed in a V-groove located in a top surface of the semiconductor substrate.

18. The optical system according to claim 13, wherein:
the optical fiber includes a core, a cladding layer, and an insulating jacket; and
the insulating jacket is removed from the optical fiber along portions thereof where the optical fiber is disposed in the V-groove of the semiconductor substrate.

19. The optical system according to claim 13, further comprising:
a V-groove block adjacent to the semiconductor substrate to support the optical fiber,
wherein the V-groove block includes a groove co-linear with the V-groove of the semiconductor substrate, and
wherein the optical fiber is positioned within the groove of the V-groove block and the V-groove of the semiconductor substrate to be aligned with the bridge waveguide structure.

20. The optical system according to claim 13, further comprising:
a carrier, wherein the semiconductor substrate and the V-groove block each overlie the carrier; and
a strain relief adhesive layer configured to secure the optical fiber to the carrier.

* * * * *